(12) United States Patent
Choi et al.

(10) Patent No.: US 8,678,633 B2
(45) Date of Patent: Mar. 25, 2014

(54) LAMP ELECTRODE PRINTED CIRCUIT BOARD AND BACKLIGHT UNIT INCLUDING THE SAME

(75) Inventors: Byung-Jin Choi, Gyeongsangbuk-do (KR); Hong-Sung Song, Gyeongsangbuk-do (KR); Woong-Ki Min, Daegu (KR)

(73) Assignee: LG Display Co., Ltd., Seoul (KR)

( * ) Notice: Subject to any disclaimer, the term of this patent is extended or adjusted under 35 U.S.C. 154(b) by 736 days.

(21) Appl. No.: 12/153,267

(22) Filed: May 15, 2008

(65) Prior Publication Data

US 2008/0284941 A1 Nov. 20, 2008

(30) Foreign Application Priority Data

May 18, 2007 (KR) .................. 10-2007-0048695

(51) Int. Cl.
*F21V 7/04* (2006.01)

(52) U.S. Cl.
USPC .............................. 362/561; 362/97.2; 349/70

(58) Field of Classification Search
USPC ......... 362/33, 97.1, 97.2, 260, 561, 600, 606, 362/614, 630–634; 349/58, 61–70; 361/748, 760; 174/138 G, 250, 260; 439/79, 82, 83, 329, 541, 591, 620.06, 439/620.12, 629, 630, 632, 636, 747, 816, 439/845, 849, 866, 876, 947
See application file for complete search history.

(56) References Cited

U.S. PATENT DOCUMENTS

| | | | | |
|---|---|---|---|---|
| 4,025,793 A | * | 5/1977 | Shaw et al. | 250/370.01 |
| 4,037,898 A | * | 7/1977 | Guyette | 439/82 |
| 4,332,430 A | * | 6/1982 | Clark | 439/83 |
| 5,169,322 A | * | 12/1992 | Frantz et al. | 439/82 |
| 5,229,328 A | * | 7/1993 | Bregman et al. | 29/827 |
| 5,453,582 A | * | 9/1995 | Amano et al. | 174/261 |
| 5,607,313 A | * | 3/1997 | Nyman | 439/83 |
| 6,191,539 B1 | * | 2/2001 | Green | 315/249 |
| 6,389,691 B1 | * | 5/2002 | Rinne et al. | 29/843 |
| 6,583,019 B2 | * | 6/2003 | Vandermeulen et al. | 438/382 |
| 6,665,025 B2 | * | 12/2003 | Lee | 349/59 |
| 7,128,623 B2 | * | 10/2006 | Kitajima | 439/876 |
| 7,434,979 B2 | * | 10/2008 | Kim | 362/634 |
| 7,527,406 B2 | * | 5/2009 | Kwon et al. | 362/561 |

(Continued)

FOREIGN PATENT DOCUMENTS

| | | |
|---|---|---|
| CN | 1155369 A | 7/1997 |
| CN | 1811565 A | 8/2006 |
| JP | 2007-12321 A | 1/2007 |

OTHER PUBLICATIONS

English-language translation of the Office Action issued Aug. 28, 2009 in corresponding Chinese Application No. 200810097585.8.

*Primary Examiner* — Hargobind S Sawhney
(74) *Attorney, Agent, or Firm* — Morgan, Lewis & Bockius LLP

(57) ABSTRACT

A lamp electrode printed circuit board of a backlight unit includes an insulating substrate, first and second conductive patterns on the insulating substrates along a first direction and in parallel, a connecting pattern extending from one of the first and second conductive patterns, a connecting pad at one end of the connecting pattern, auxiliary patterns extending from an edge of the connecting pad, and lamp holders electrically connected to the first and second conductive patterns and spaced apart from each other along the first direction.

13 Claims, 7 Drawing Sheets

(56) References Cited

U.S. PATENT DOCUMENTS

| | | |
|---|---|---|
| 7,671,936 B2 * | 3/2010 | Chang ............................ 349/65 |
| 7,905,625 B2 * | 3/2011 | Kim et al. ...................... 362/225 |
| 2004/0156183 A1 * | 8/2004 | Kim ................................ 362/31 |
| 2005/0141220 A1 | 6/2005 | Kim et al. |
| 2006/0103775 A1 * | 5/2006 | Chung ............................ 349/58 |
| 2007/0189041 A1 * | 8/2007 | Chen et al. .................... 362/631 |

* cited by examiner

LAMP ELECTRODE PRINTED CIRCUIT BOARD AND BACKLIGHT UNIT INCLUDING THE SAME

The invention claims the benefit of Korean Patent Application No. 2007-0048695 filed in Korea on May 18, 2007, which is hereby incorporated by reference for all purposes as if fully set forth herein.

BACKGROUND OF THE INVENTION

1. Field of the Invention

The invention relates to a liquid crystal display device, and more particularly, to a lamp electrode printed circuit board of a backlight unit for a liquid crystal display device and a backlight unit including the same.

2. Discussion of the Related Art

According to the rapid development in information technology, flat panel display (FPD) devices, such as liquid crystal display (LCD) devices, plasma display panels (PDPs), electroluminescent display (ELD) devices and field emission display (FED) devices, have been developed and have replaced cathode ray tubes (CRTs).

Among these devices, liquid crystal display (LCD) devices are most widely used for monitors of notebook computers, monitors of personal computers and televisions due to excellent moving images and high contrast ratio.

Liquid crystal display (LCD) devices use the optical anisotropy and polarization properties of liquid crystal molecules of a liquid crystal layer to produce an image. The liquid crystal molecules have long and thin shapes, and because of the optical anisotropy property, the polarization of light varies with the alignment direction of the liquid crystal molecules. The alignment direction of the liquid crystal molecules can be controlled by varying the intensity of an electric field applied to the liquid crystal layer. Accordingly, an LCD device includes two substrates spaced apart and facing each other and a liquid crystal layer interposed between the two substrates. Each of the two substrates includes an electrode on a surface facing the other of the two substrates. A voltage is applied to each electrode to induce an electric field between the electrodes and the alignment of the liquid crystal molecules as well as the transmittance of light through the liquid crystal layer is controlled by varying the intensity of the electric field.

The LCD devices require an additional light source because the LCD devices are not self-luminescent. Therefore, a backlight unit is disposed at a rear side of a liquid crystal (LC) panel and emits light into the LC panel, whereby discernible images can be displayed.

Backlight units are classified into an edge type and a direct type according to the position of a light source with respect to a display panel. In edge-type backlit units, one or a pair of lamps are disposed at one side or each of two sides of a light guide panel of a backlight unit. In direct-type backlight units, a plurality of lamps are disposed directly under a display panel.

The edge-type backlight units can be easily fabricated, but the edge-type backlight units are disadvantageous to a large size display device. On the other hand, the direct-type backlight units are advantageous to a large size display device because of uniformity of light.

Lamps are classified by cold cathode fluorescent lamps (CCFLs), each of which has electrodes inside of a tube, external electrode fluorescent lamps (EEFLs), each of which has electrodes outside of a tube, or electrodeless fluorescent lamps (EFLs), which do not have electrodes.

FIG. 1 is an exploded perspective view of schematically illustrating a liquid crystal display (LCD) module including a direct-type backlight unit according to the related art. In FIG. 1, a related art LCD module includes a liquid crystal panel 10, a back light unit 20, a support main 30, a top cover 40 and a cover bottom 50. The liquid crystal panel 10 substantially displays images. A gate printed circuit board 18 and a source printed circuit board 19 are attached at respective sides of the liquid crystal panel 10 adjacent to each other via flexible circuit boards 16.

The backlight unit 20 is disposed under the liquid crystal panel 10. Side surfaces of the liquid crystal panel 10 and the backlight unit 20 are surrounded by the support main 30 having a rectangular frame shape. The top cover 40 covers edges of a front surface of the liquid crystal panel 10, and the cover bottom 50 covers a rear surface of the backlight unit 20. The top cover 40 and the cover bottom 50 are combined with the support main 30 to thereby constitute one-united body.

The backlight unit 20 includes a reflection sheet 22, a plurality of lamps 24 arranged over the reflection sheet 22, and a plurality of optical sheets 26 over the lamps 24. Both ends of each lamp 24 are fixed by respective side supports (not shown), which are combined with the cover bottom 50.

The lamps 24 are used as a light source of the backlight unit 20 and include external electrode fluorescent lamps, each of which has electrodes outside of a glass tube. The lamps 24 are spaced apart from and arranged in parallel with each other over the reflection sheet 22. External electrodes of each lamp 24 are connected to common electrodes 23, which may be referred to as a lamp electrode, and thus a voltage is simultaneously applied to the external electrodes of each lamp 24.

The liquid crystal display device module is referred to as a so-called rear front mounting structure, wherein the module is assembled and combined by screws 60 passing through four corners of the cover bottom 50 and then inserted into the support main 30. In the structure, heads of the screws 60 are disposed at a rear surface of the cover bottom 50, and the exterior of the module is tidy.

However, since the liquid crystal display device module of the rear front mounting structure is assembled by only the screws 60 passing through the four corners, this may weaken a fixed force and decrease reliability in keeping a shape of the module. Accordingly, to increase the fixed force, screws may be further used along four edges in addition to the four corners of the liquid crystal display device module. But, in regions A corresponding to two opposite edges of the liquid crystal display device module, where the common electrodes 23 for the lamps 24 are formed, it is difficult that the screws are used owing to the common electrodes 23.

FIG. 2 is an enlarged view of the region A of FIG. 1. In FIG. 2, each lamp 24 has electrodes 28 at both ends, and common electrodes 23 are disposed at both ends of each lamp 24. The common electrodes 23 are adjacent to inner surfaces of two edges of the cover bottom 50 facing each other. Therefore, even though screws are used along the two edges of the cover bottom 50, the screws may not pass through the common electrodes 23 formed of a metallic material, whereby two edges of the liquid crystal display device module cannot be combined.

In addition, an inverter and driving elements for applying voltages to the common electrode 23 are formed on a backlight printed circuit board (not shown), which is disposed at a rear surface of the cover bottom 50 of FIG. 1. Therefore, a lamp wire (not shown) for electrically connecting the common electrode 23 and the backlight printed circuit board (not shown) should be stably and efficiently connected to common electrode 23.

SUMMARY OF THE INVENTION

Accordingly, the present invention is directed to a lamp electrode printed circuit board of a backlight unit for a liquid crystal display device and a backlight unit including the same that substantially obviate one or more of the problems due to limitations and disadvantages of the related art.

An advantage of the present invention is to provide a lamp electrode printed circuit board of a backlight unit for a liquid crystal display device and a backlight unit including the same that stably fix a liquid crystal display device module.

Another advantage of the present invention is to provide a lamp electrode printed circuit board of a backlight unit for a liquid crystal display device and a backlight unit including the same that efficiently connect a lamp electrode and a backlight printed circuit board.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, a lamp electrode printed circuit board of a backlight unit includes an insulating substrate, first and second conductive patterns on the insulating substrates along a first direction and in parallel, a connecting pattern extending from one of the first and second conductive patterns, a connecting pad at one end of the connecting pattern, auxiliary patterns extending from an edge of the connecting pad, and lamp holders electrically connected to the first and second conductive patterns and spaced apart from each other along the first direction.

In another aspect, a lamp electrode printed circuit board of a backlight unit includes an insulating substrate, first and second conductive patterns on the insulating substrates along a first direction and in parallel, a connecting pattern extending from one of the first and second conductive patterns, a connecting pad at one end of the connecting pattern and including a plurality of holes therein, and lamp holders electrically connected to the first and second conductive patterns and spaced apart from each other along the first direction.

In another aspect, a lamp electrode printed circuit board of a backlight unit includes an insulating substrate, first and second conductive patterns on the insulating substrates along a first direction and in parallel, a connecting pattern extending from one of the first and second conductive patterns, a connecting pad at one end of the connecting pattern, a guide groove on the insulating substrate from a side of the connecting pad, and lamp holders electrically connected to the first and second conductive patterns and spaced apart from each other along the first direction, wherein the connecting pad is connected to a connecting terminal of a lamp wire, and the lamp wire is inserted in the guide groove.

In another aspect, a backlight unit for a liquid crystal display device includes a reflection sheet, external electrode fluorescent lamps over the reflection sheet, a couple of lamp electrode printed circuit boards fixing and supporting the external electrode fluorescent lamps and applying voltages to the external electrode fluorescent lamps, wherein each lamp electrode printed circuit board includes a connecting pad, auxiliary patterns extending from an edge of the connecting pad, and first and second conductive patterns, a backlight printed circuit board providing voltages to the lamp electrode circuit boards, and a plurality of optical sheets over the external electrode fluorescent lamps, wherein the backlight printed circuit board is electrically connected to the connecting pad through a lamp wire.

In another aspect, a backlight unit for a liquid crystal display device includes a reflection sheet, external electrode fluorescent lamps over the reflection sheet, a couple of lamp electrode printed circuit boards fixing and supporting the external electrode fluorescent lamps and applying voltages to the external electrode fluorescent lamps, wherein each lamp electrode printed circuit board includes a connecting pad including a plurality of holes therein and first and second conductive patterns, a backlight printed circuit board providing voltages to the lamp electrode circuit boards, and a plurality of optical sheets over the external electrode fluorescent lamps, wherein the backlight printed circuit board is electrically connected to the connecting pad through a lamp wire.

In another aspect, a backlight unit for a liquid crystal display device includes a reflection sheet, external electrode fluorescent lamps over the reflection sheet, a couple of lamp electrode printed circuit boards fixing and supporting the external electrode fluorescent lamps and applying voltages to the external electrode fluorescent lamps, wherein each lamp electrode printed circuit board includes a connecting pad, first and second conductive patterns and a guide groove, a backlight printed circuit board providing voltages to the lamp electrode circuit boards, and a plurality of optical sheets over the external electrode fluorescent lamps, wherein the backlight printed circuit board is electrically connected to the connecting pad through a lamp wire, and the lamp wire is inserted in the guide groove.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, examples of which are illustrated in the accompanying drawings.

Figure 1:
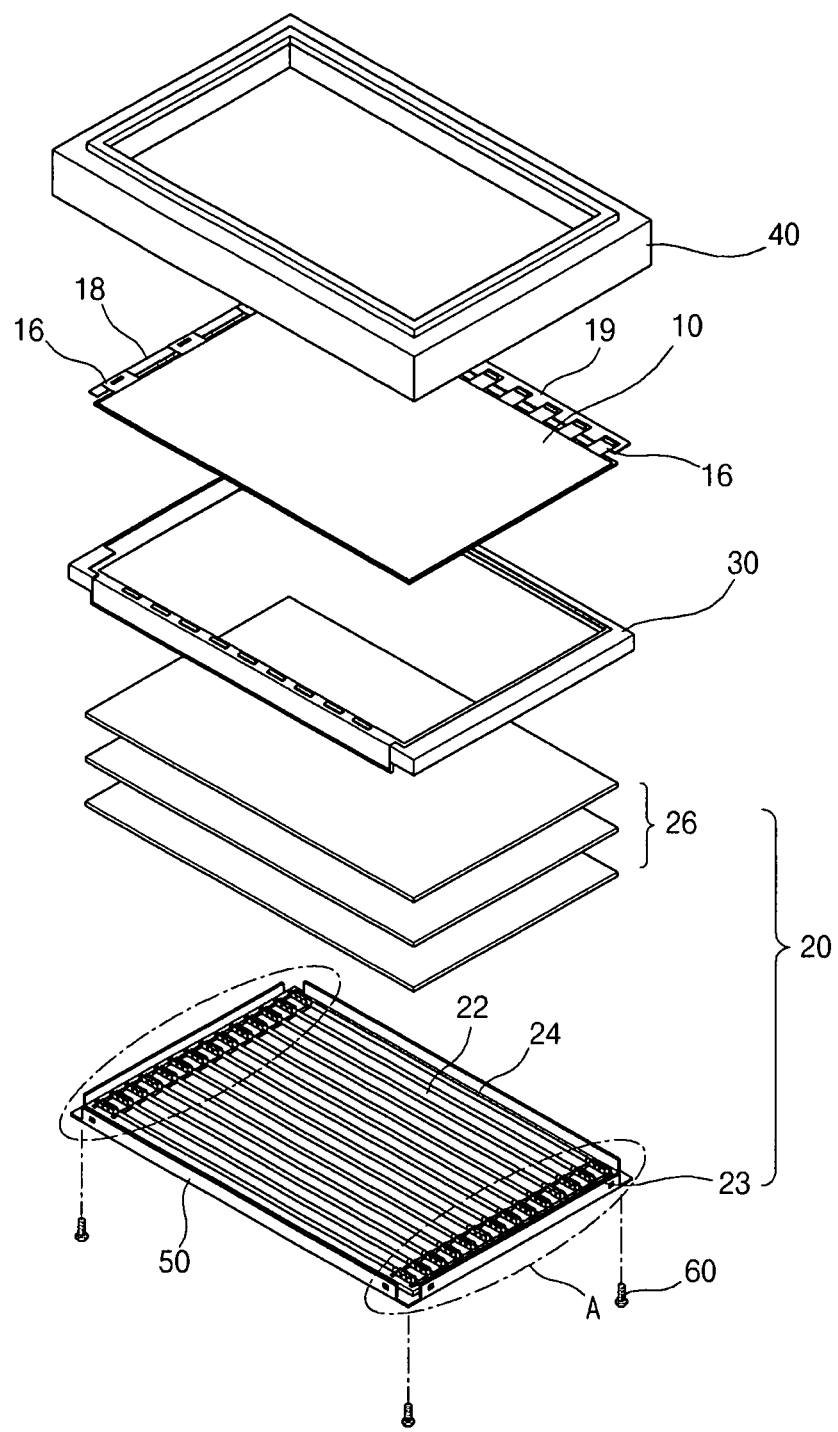
FIG. 1 is an exploded perspective view of schematically illustrating a liquid crystal display (LCD) module including a direct-type backlight unit according to the related art.
Figure 2:
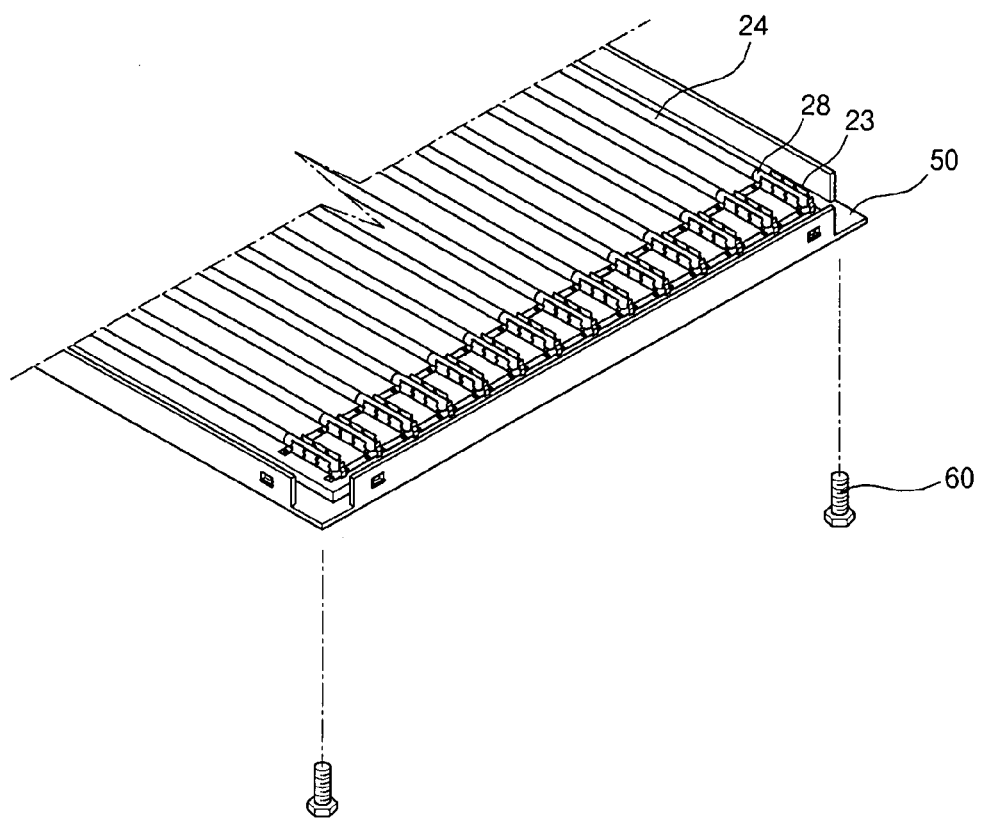
FIG. 2 is an enlarged view of the region A of FIG. 1.
Figure 3:
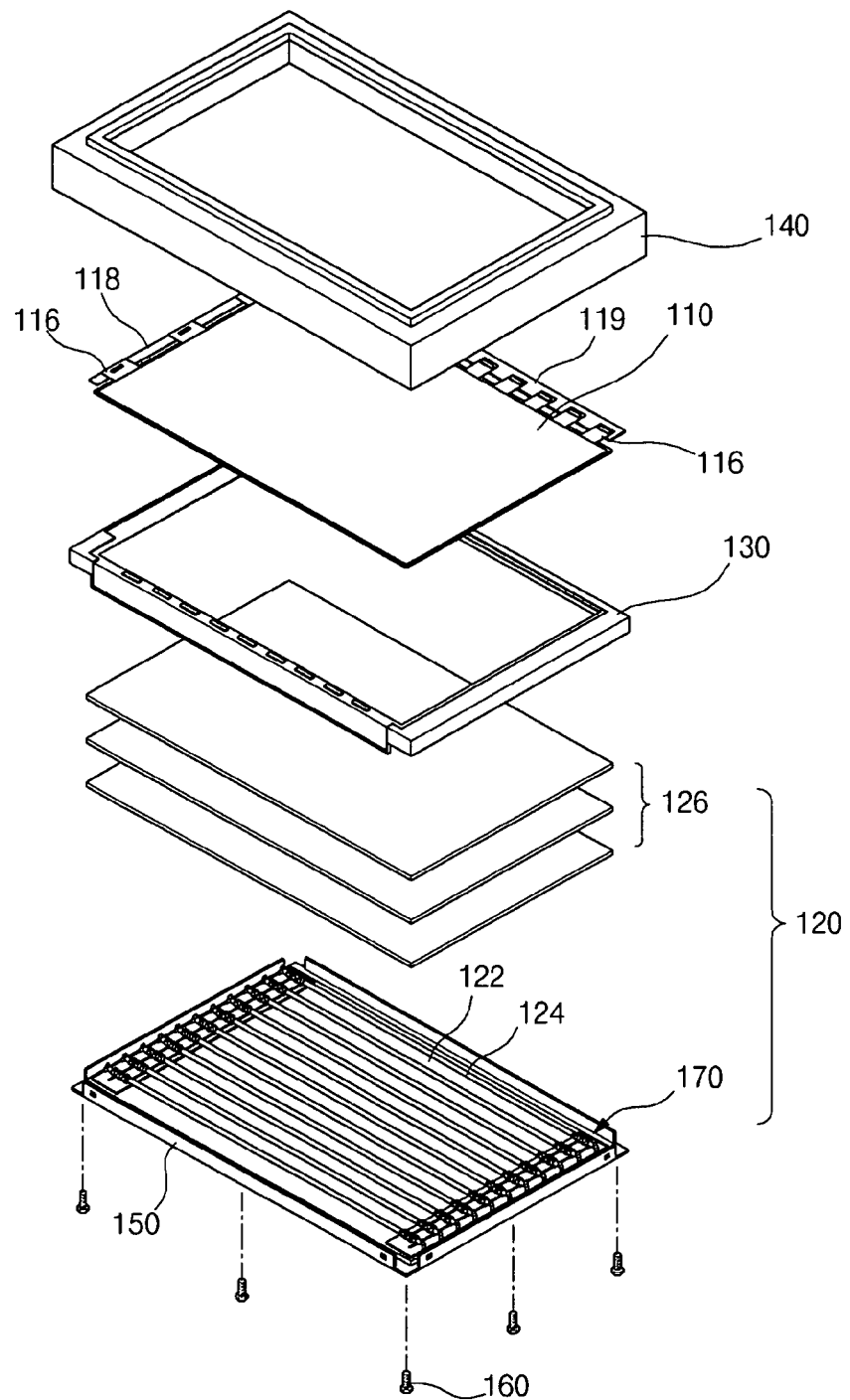
FIG. 3 is a perspective view of schematically illustrating an LCD module including a direct-type backlight unit according to an exemplary embodiment of the present invention.

FIG. 3 is a perspective view of schematically illustrating an LCD module including a direct-type backlight unit according to an exemplary embodiment of the present invention.

In FIG. 3, an LCD module includes a liquid crystal panel 110, a backlight unit 120, a support main 130, a top cover 140, and a cover bottom 150. The backlight unit 120 is disposed under the liquid crystal panel 110. The support main 130 surrounds side surfaces of the liquid crystal panel 110 and the backlight unit 120 and is fixed with the cover bottom 150, which covers a rear surface of the backlight unit 120. The top case 140 surrounds edges of a front surface of the liquid crystal panel 110 and is combined with the support main 130 and the cover bottom 150.

More particularly, the liquid crystal panel 110 displays images. The liquid crystal panel 110 includes first and second substrates faced and attached to each other with a liquid crystal layer interposed therebetween. Gate and source printed circuit boards 118 and 119 are attached to adjacent sides of the liquid crystal panel 110 via flexible printed circuit boards 116, respectively. The gate and source printed circuit boards 118 and 119 are bent toward a side surface or a rear surface of the cover bottom 150 during a module process. The gate printed circuit board 118 provides gate lines (not shown) with scanning signals for turning on/off the thin film transistors (not shown), and the source printed circuit board 119 provides data lines (not shown) with image signals for each frame.

The backlight unit 120 provides light to the liquid crystal panel 110. The backlight unit 120 includes a reflection sheet 122, a plurality of lamps 124 over the reflection sheet 122, and optical sheets 126 over the lamps 124. The optical sheets 126 are sequentially disposed at a rear surface of the liquid crystal panel 110. The lamps 124 are arranged in parallel. The reflection sheet 122 reflects light toward the liquid crystal panel 110.

The lamps 124, which are used as a light source of the backlight unit 120, may be external electrode fluorescent lamps, each of which has electrodes outside of a tube. The backlight unit 120 may further include common electrode printed circuit boards 170. The common electrode printed circuit boards 170 fix the lamps 124 and supply the lamps 124 with voltages from the exterior at the same time. The common electrode printed circuit boards 170 may be referred to as a lamp electrode printed circuit boards.

Side surfaces of the liquid crystal panel 110 and the backlight unit 120 are surrounded by the support main 130. The support main 130 may have a rectangular frame shape and may be formed of resin or a metallic material.

The cover bottom 150 is combined with the support main 130 and is close to a rear surface of the reflection sheet 122. The cover bottom 150 prevents the backlight unit 120 from moving.

The top case 140 covers edges of the front surface of the liquid crystal panel 110 to prevent the liquid crystal panel 110 from moving and light from leaking. The top case 140 is combined with the support main 130 and the cover bottom 150 to unite units of the liquid crystal display device module. Accordingly, the liquid crystal display device module is completed.

In the liquid crystal display device module, screws 160 pass through four corners and four edges of the cover bottom and are inserted into the support main 130. Therefore, the fixed force of the liquid crystal display device module is increased. This can be achieved by the common electrode printed circuit boards, which are formed at both sides of each of the lamps 124, and will be explained with reference to FIG. 4.

Figure 4:
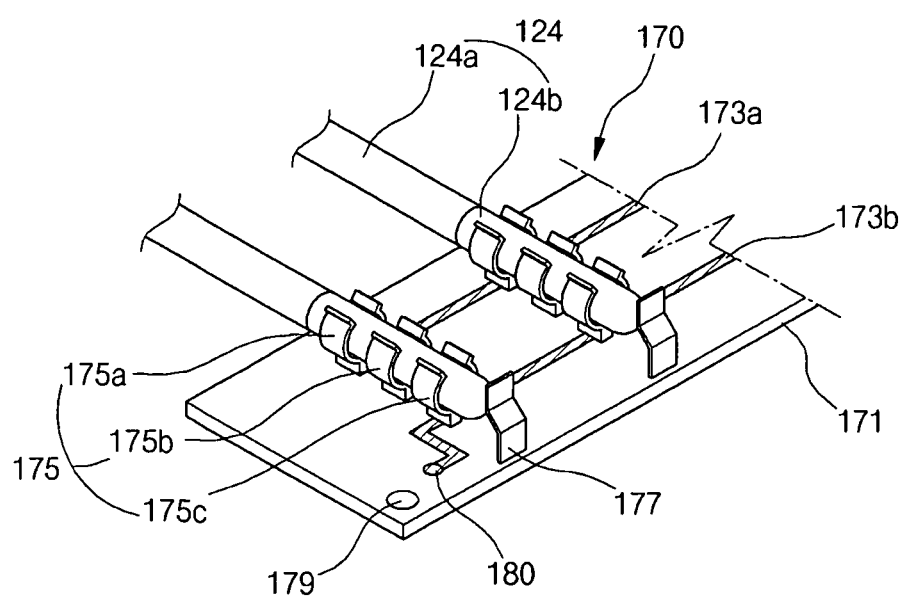
FIG. 4 is a view of schematically illustrating lamps and a common electrode printed circuit board according to the present invention.

FIG. 4 is a view of schematically illustrating lamps and a common electrode printed circuit board according to the present invention.

In FIG. 4, lamps 124 of the present invention may be external electrode fluorescent lamps, in which external electrodes 124b cover outer surfaces of both ends of a glass tube 124a. Discharge gases such as mixed inert gases or mercury (Hg) are packed in the glass tube 124a, and inner surfaces of the glass tube 124a are coated with fluorescent materials.

The lamps 124 are supplied with voltages from the outside via the common electrode printed circuit board, which is connected to the external electrodes 124b at ends of the lamps 124, and are stably fixed over the reflection sheet 122 of FIG. 3 by the common electrode printed circuit board.

More particularly, the common electrode printed circuit board 170 includes an insulating substrate 171, first and second copper line patterns 173a and 173b, and one united-body lamp holders 175. The first and second copper line patterns 173a and 173b for applying voltages are formed at both sides of the insulating substrate 171 along a length direction. The first and second copper line patterns 173a and 173b may be formed of other conductive materials. The one united-body lamp holders 175 are connected to the first and second copper line patterns 173a and 173b.

The one united-body lamp holders 175 have an elastic ring shape such that the lamps 124 are fixed into the one united-body lamp holders 175. Each of the one united-body lamp holders 175 includes a plurality of holders 175a, 175b and 175c, which are spaced apart from each other along a direction, to directly fix the lamps 124.

The one united-body lamp holders 175 are disposed and spaced apart along the length direction of the first and second copper line patterns 173a and 173b, and the number of the one united-body lamp holders 175 equal to the number of the lamps 124.

The common electrode printed circuit board 170 further includes stoppers 177 to prevent lamps 124 from moving left and right. The stoppers 177 are disposed the outside of the second copper line pattern 173b, where ends of the lamps 124 are disposed, along a direction perpendicular to the insulating substrate 171.

Each lamp 124 is fixed and supported by the one united-body lamp holders 175 of the common electrode printed circuit board 170, which are disposed at both sides of a liquid crystal display device and is not moved or damaged by exterior impacts. The lamps 124 are applied with voltages through the first and second copper line patterns 173a and 173b connected to the one united-body lamp holders 175.

That is, the lamps 124, which are arranged in parallel, are electrically connected by the first and second copper line patterns 173a and 173b and are driven by an inverter (not shown).

At least three screw holes 179 are formed with a uniform space in the insulating substrate 171 of the common electrode printed circuit board 170 along the length direction. The screw holes 179 are formed at both ends and a center of the common electrode printed circuit board 170. Screws 160 of FIG. 3 passing through the cover bottom 150 of FIG. 3 are inserted into the support main 130 of FIG. 3 via the screw holes 170 of the common electrode printed circuit board 170.

Accordingly, at four corners and four edges of the liquid crystal display device module, the units of the liquid crystal display device module are combined by the screws 160 of FIG. 3, and stable fixed forces can be obtained.

Meanwhile, the inverter (not shown) and driving elements (not shown) for applying voltages to the first and second copper line patterns 173a and 173b are formed on a backlight printed circuit board (not shown), which is disposed at a rear surface of the cover bottom 150 of FIG. 3.

Here, a connecting pad 180 is further formed on the common electrode printed circuit board 170 to electrically connect the first and second copper line pattern 173a and 173b with the backlight printed circuit board (not shown).

Figure 5:
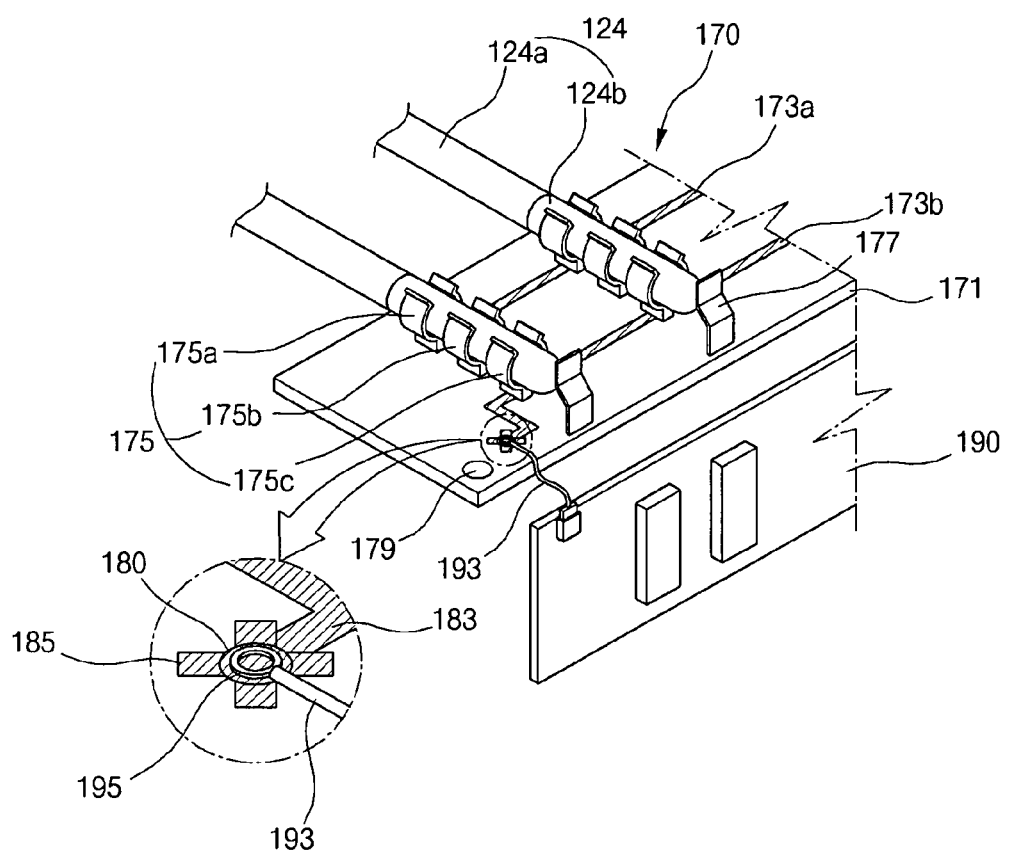
FIG. 5 is a view of schematically illustrating a common electrode printed circuit board according to a first embodiment of the present invention.

FIG. 5 is a view of schematically illustrating a common electrode printed circuit board according to a first embodiment of the present invention.

In FIG. 5, first and second copper line patterns 173a and 173b are formed at both sides on an insulating substrate 171 of a common electrode printed circuit board 170 along a length direction. A plurality of one united-body lamp holders 175 for fixing a plurality of lamps 124 are formed on the insulating substrate 171 and are connected to the first and second copper line patterns 173a and 173b. Each one united-body lamp holder 175 includes a plurality of holders 175a, 175b and 175c.

A connecting pad 180 is formed at a side of the insulting substrate 171 of the common electrode printed circuit board 170. The connecting pad 180 is connected to one of the first and second copper line patterns 173a and 173b through a connecting pattern 183. The connecting pattern 183 and the connecting pad 180 electrically connect the first and second copper line patterns 173a and 173b with the backlight printed circuit board 190.

More particularly, a lamp wire 193 is provided for electrical connection between the backlight printed circuit board 190 and the common electrode printed circuit board 170. The lamp wire 193 includes a connecting terminal 195 at one end, and the connecting terminal 195 is directly connected to the connecting pad 180 of the common electrode printed circuit board 170 by soldering.

Voltages from the backlight printed circuit board 190 are applied to the first and second copper line patterns 173a and 173b through the lamp wire 193 and the connecting pad 180, and the voltages from the first and second copper line patterns 173a and 173b are applied to the holders 175a, 175b and 175c of the one united-body lamp holders 175 to drive the lamps 124.

In the first embodiment, auxiliary patterns 185 are formed around the connecting pad 180.

The connecting pad 180 is a conductive pattern for electrical connection such that currents flow therethrough. The auxiliary patterns 185 may extend from an edge of the connecting pad 180 along four directions.

In the meantime, the auxiliary patterns 185 may extend from the edge of the connecting pad 180 along other directions.

A sticking area of the connecting pad 180 and the connecting terminal 195 of the lamp wire 193 by soldering increases, and thus an adhesion force between the connecting pad 180 and the connecting terminal 195 is strengthened.

Here, the lamp wire 193 may not overlap the auxiliary patterns 185.

Beneficially, the auxiliary patterns 185 may be formed of the same material as the connecting pad 180. The auxiliary patterns 185 may have steps and form grooves on the common electrode printed circuit board 170.

The shape of the connecting pad 180 can be changed according to the connecting terminal 195 of the lamp wire 193, and the auxiliary patterns 185 can have various shapes.

Figure 6:
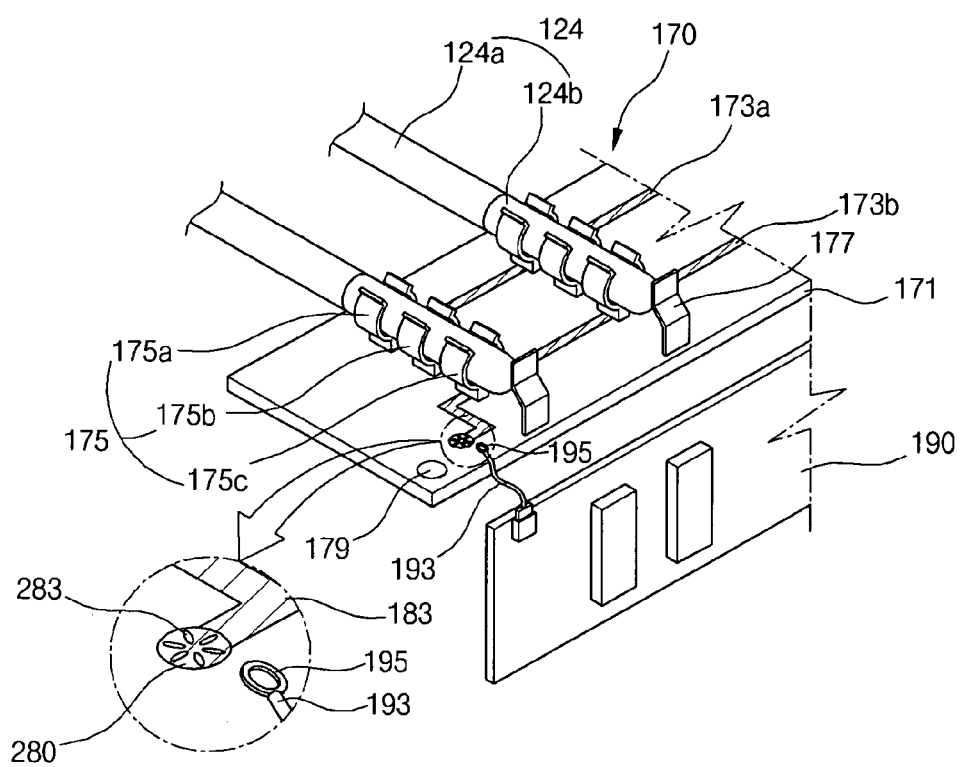
FIG. 6 is a view of schematically illustrating a common electrode printed circuit board according to a second embodiment of the present invention.

FIG. 6 is a view of schematically illustrating a common electrode printed circuit board according to a second embodiment of the present invention. Here, the same parts as FIG. 5 of the first embodiment may have the same references, and explanations for the same parts will be omitted.

In FIG. 6, a connecting pad 280 at a side of the common electrode printed circuit board 170 includes elliptical holes 283 therein. The elliptical holes 283 are formed along all directions from a center of the connecting pad 280. Opposite elliptical holes 283 may be symmetrical to each other with respect to the center of the connecting pad 280. The elliptical holes 283 decrease soldering time of the connecting pad 280 and the connecting terminal 195 of the lamp wire 193. That is, during soldering of the connecting pad 280 and the connecting terminal 195, an area of the connecting pad 280 stuck with solder is minimized, and the soldering time is decreased.

At this time, the connecting terminal 195 is disposed over the connecting pad 280 which is stuck with solder, and predetermined force is applied such that the solder sticking the connecting pad 280 entirely covers the connecting terminal 195. The connecting pad 280 and the connecting terminal 195 are strongly stuck together, and waste of solder is prevented.

An area of soldering, desirably, may be the same as the first embodiment to keep relatively strong adhesion force. To more improve the adhesion force, additional patterns (not shown) may be formed around the connecting pad 280, and a soldering area of the connecting pad 280 and the connecting terminal 195 may be increased.

The shape of the connecting pad 280 may be changed according to the connecting terminal 195 of the lamp wire 193. The elliptical holes 283 of the connecting pad 280 may have other shapes.

Figure 7:
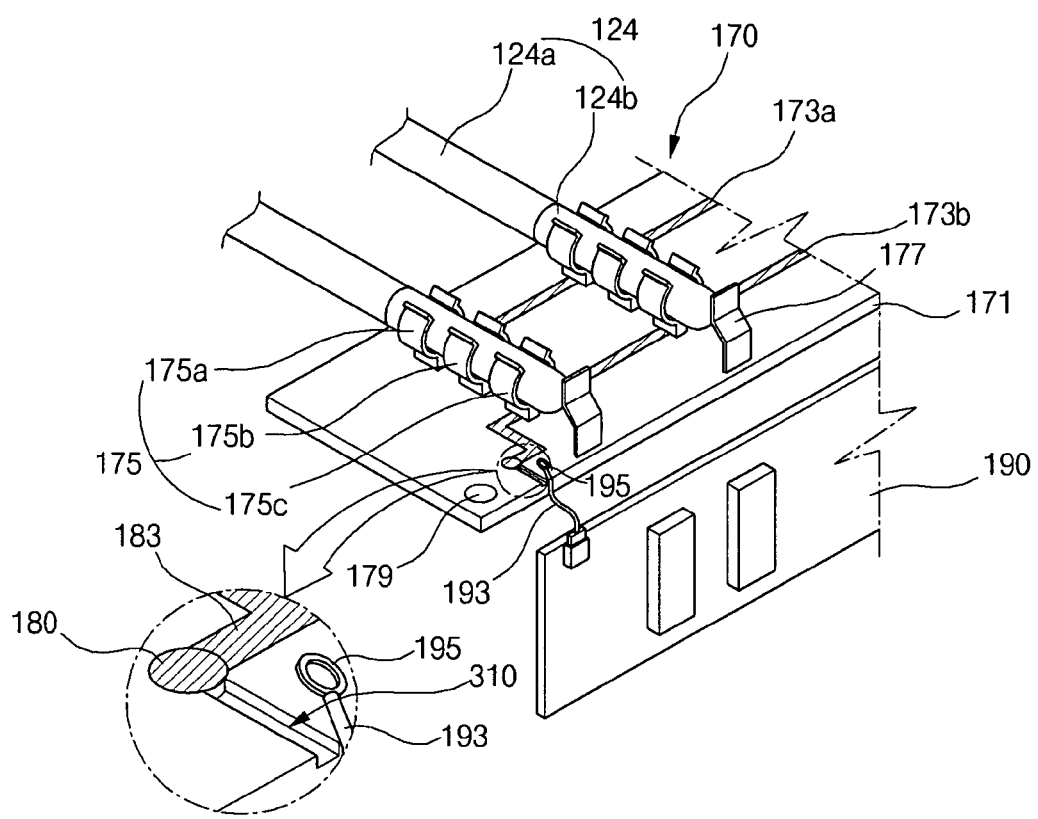
FIG. 7 is a view of schematically illustrating a common electrode printed circuit board according to a third embodiment of the present invention.

FIG. 7 is a view of schematically illustrating a common electrode printed circuit board according to a third embodiment of the present invention. Here, the same parts as FIG. 5 of the first embodiment may have the same references, and explanations for the same parts will be omitted.

In FIG. 7, a guide groove 310 is formed on the insulating substrate 171 of the common electrode printed circuit board 170 at a side of the connecting pad 180. The lamp wire 193 is inserted into the guide groove 310 and is fixed.

The connecting terminal 195 at one end of the lamp wire 193 is directly connected to the connecting pad 180 on the common electrode printed circuit board 170 by soldering, and thus the first and second copper line patterns 173a and 173b are electrically connected to the backlight printed circuit board 190. At this time, the lamp wire 193 is fixed in the guide groove 310 and is prevent from breaking away.

In addition, an increase in a thickness of the liquid crystal display device module due to the lamp wire 193 can be prevented.

The guide groove 310 may have various shapes according to the lamp wire 193.

In the present invention, the units of the liquid crystal display device module can be combined in a region where the common electrodes of the backlight unit are formed, and thus the fixed force of the liquid crystal display device module can be increased.

Additionally, auxiliary patterns are formed around the connecting pad on the common electrode printed circuit board, and an area of soldering the connecting pad and the connecting terminal is increased. Therefore, the adhesion force between the connection pad and the connecting terminal by soldering is strengthened.

Moreover, when a plurality of holes is formed in the connecting pad, the soldering time of the connecting pad and the connecting terminal of the lamp wire may be shortened.

Further, the guide groove for the lamp wire may be formed at a side of the connecting pad on the common electrode printed circuit board, and the thickness of the liquid crystal display device module is not increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A lamp electrode printed circuit board of a backlight unit, comprising:
   an insulating substrate;
   first and second conductive patterns on a top surface of the insulating substrate along a first direction and in parallel;
   a connecting pattern extending from one of the first and second conductive patterns;
   a connecting pad at one end of the connecting pattern;
   auxiliary patterns on the top surface of the insulating substrate and extending from an edge of the connecting pad such that an area of soldering the connecting pad and a connecting terminal of a lamp wire is increased and adhesion between the connecting pad and the connecting terminal of the lamp wire is strengthened; and
   a plurality of lamp holders each respectively electrically connected to both the first and second conductive patterns and spaced apart from each other along the first direction,
   wherein the auxiliary patterns radially extend from the edge of the connecting pad, and
   wherein each of the auxiliary patterns is flat and a bottom surface of each of the flat auxiliary patterns is disposed directly on and directly contacts the top surface of the insulating substrate.

2. The lamp electrode printed circuit board of a backlight unit according to claim 1, wherein the insulating substrate includes at least three screw holes along the first direction.

3. The lamp electrode printed circuit board of a backlight unit according to claim 1, further comprising stoppers upward on the insulating substrate.

4. The lamp electrode printed circuit board of a backlight unit according to claim 3, wherein the stoppers correspond to the lamp holders, respectively, along a second direction perpendicular to the first direction.

5. The lamp electrode printed circuit board of a backlight unit according to claim 1, wherein the auxiliary patterns and connecting pad are formed of a same material.

6. A lamp electrode printed circuit board of a backlight unit, comprising:
   an insulating substrate;
   first and second conductive patterns on the insulating substrate along a first direction and in parallel;
   a connecting pattern extending from one of the first and second conductive patterns;
   a connecting pad at one end of the connecting pattern and including a plurality of holes therein such that an area of the connecting pad stuck with solder is minimized and soldering time of the connecting pad and a connecting terminal of a lamp wire is shortened and
   a plurality of lamp holders each respectively electrically connected to both the first and second conductive patterns and spaced apart from each other along the first direction,
   wherein opposite ones of the plurality of holes are symmetrical to each other with respect to a center of the connecting pad, and
   wherein the connecting pad is disposed directly on, is flush to, and directly contacts a top surface of the insulating substrate, and
   wherein the plurality of holes directly exposes the top surface of the insulating substrate.

7. The lamp electrode printed circuit board of a backlight unit according to claim 6, wherein the insulating substrate includes at least three screw holes along the first direction.

8. The lamp electrode printed circuit board of a backlight unit according to claim 6, further comprising stoppers upward on the insulating substrate.

9. The lamp electrode printed circuit board of a backlight unit according to claim 8, wherein the stoppers correspond to the lamp holders, respectively, along a second direction perpendicular to the first direction.

10. A lamp electrode printed circuit board of a backlight unit, comprising:
    an insulating substrate;
    first and second conductive patterns on the insulating substrates along a first direction and in parallel;
    a connecting pattern extending from one of the first and second conductive patterns;
    a connecting pad at one end of the connecting pattern;
    a guide groove on the insulating substrate from a side of the connecting pad; and
    lamp holders electrically connected to the first and second conductive patterns and spaced apart from each other along the first direction,
    wherein the connecting pad is connected to a connecting terminal of a lamp wire, and the lamp wire is inserted in the guide groove.

11. The lamp electrode printed circuit board of a backlight unit according to claim 10, wherein the insulating substrate includes at least three screw holes along the first direction.

12. The lamp electrode printed circuit board of a backlight unit according to claim 10, further comprising stoppers upward on the insulating substrate.

13. The lamp electrode printed circuit board of a backlight unit according to claim 12, wherein the stoppers correspond to the lamp holders, respectively, along a second direction perpendicular to the first direction.

* * * * *